US012588460B2

(12) United States Patent
Quli et al.

(10) Patent No.: US 12,588,460 B2
(45) Date of Patent: Mar. 24, 2026

(54) SENSOR CONFIGURATION FOR PROCESS CONDITION MEASURING DEVICES

(71) Applicant: KLA Corporation, Milpitas, CA (US)

(72) Inventors: Farhat A. Quli, Castro Valley, CA (US); Andrew Nguyen, San Jose, CA (US); James Richard Bella, San Jose, CA (US); Earl Jensen, Santa Clara, CA (US); Huey Tzeng, Milpitas, CA (US); Jing Zhou, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 660 days.

(21) Appl. No.: 17/542,135

(22) Filed: Dec. 3, 2021

(65) Prior Publication Data

US 2022/0189803 A1     Jun. 16, 2022

Related U.S. Application Data

(60) Provisional application No. 63/124,031, filed on Dec. 10, 2020.

(51) Int. Cl.
*H01L 21/67* (2006.01)
*H01L 21/66* (2006.01)

(52) U.S. Cl.
CPC ........ *H01L 21/67253* (2013.01); *H01L 22/14* (2013.01)

(58) Field of Classification Search
CPC ........................... H01L 21/67253; H01L 22/14
See application file for complete search history.

(56) References Cited

U.S. PATENT DOCUMENTS

| | | | |
|---|---|---|---|
| 5,508,206 A | 4/1996 | Glenn et al. | |
| 7,109,068 B2 | 9/2006 | Akram et al. | |
| 7,307,325 B2 | 12/2007 | Kurtz et al. | |
| 7,659,614 B2 | 2/2010 | Mehrotra | |

(Continued)

FOREIGN PATENT DOCUMENTS

| | | |
|---|---|---|
| KR | 101962100 B1 | 3/2019 |
| KR | 1020190086261 A | 7/2019 |

(Continued)

OTHER PUBLICATIONS

International Search Report and Written Opinion in Application No. PCT/US2021/062288 dated Mar. 29, 2022, 10 pages.
Debroy, S., et al. "Temperature and Size Effect on the Electrical Properties of Monolayer Graphene based Interconnects for Next Generation MQCA based Nanoelectronics". Sci Rep 10, 6240 (2020). https://doi.org/10.1038/s41598-020-63360-6.

(Continued)

*Primary Examiner* — Timor Karimy
(74) *Attorney, Agent, or Firm* — Suiter Swantz IP

(57) ABSTRACT

A process condition measurement apparatus is disclosed. The apparatus includes a substrate, one or more insulation portions, a first plurality of interconnect traces, a second plurality of interconnect traces, and a plurality of sensors disposed on the substrate. The second plurality of interconnect traces is disposed over the first plurality of interconnect traces and intersects at a plurality of locations to form a matrix of interconnect junctions across one or more locations of the substrate. A respective sensor is electrically coupled to a respective trace of the first and second plurality of interconnect traces. The respective sensor is individually readable by addressing the respective trace of the first and second plurality of interconnect traces.

17 Claims, 14 Drawing Sheets

(56) References Cited

U.S. PATENT DOCUMENTS

| | | | |
|---|---|---|---|
| 9,530,796 | B2 | 12/2016 | Stuber et al. |
| 9,564,432 | B2 | 2/2017 | Or-Bach et al. |
| 10,304,817 | B2 | 5/2019 | Lin et al. |
| 10,643,895 | B2 | 5/2020 | Mebarki et al. |
| 2002/0155693 | A1 | 10/2002 | Hong et al. |
| 2006/0289763 | A1* | 12/2006 | Mundt ...................... G01J 1/02 |
| | | | 250/338.3 |
| 2007/0121273 | A1 | 5/2007 | Yamamoto et al. |
| 2010/0244247 | A1 | 9/2010 | Chang et al. |
| 2013/0328201 | A1 | 12/2013 | Wang et al. |
| 2014/0021611 | A1 | 1/2014 | Lee et al. |
| 2015/0331524 | A1* | 11/2015 | McMillen ............ A61B 5/6843 |
| | | | 345/174 |
| 2020/0083072 | A1 | 3/2020 | Quli et al. |

FOREIGN PATENT DOCUMENTS

| | | | |
|---|---|---|---|
| TW | I575693 | B | 3/2017 |
| TW | I590380 | B | 7/2017 |
| WO | 1999016601 | A1 | 4/1999 |

OTHER PUBLICATIONS

Magnetic Innovations B.V., "Magnetic Gravity compensator MI-MGC series—Technical data sheet", retrieved from Internet (2016) on Oct. 15, 2021.

Korean Patent Office, Office Action received in KR Application No. 10-2023-7020055, Mar. 24, 2025, 26 pages (including translation).

Taiwan Patent Office, Office Action received in TW Application No. 110146247, Jan. 21, 2025, 8 pages.

\* cited by examiner

300

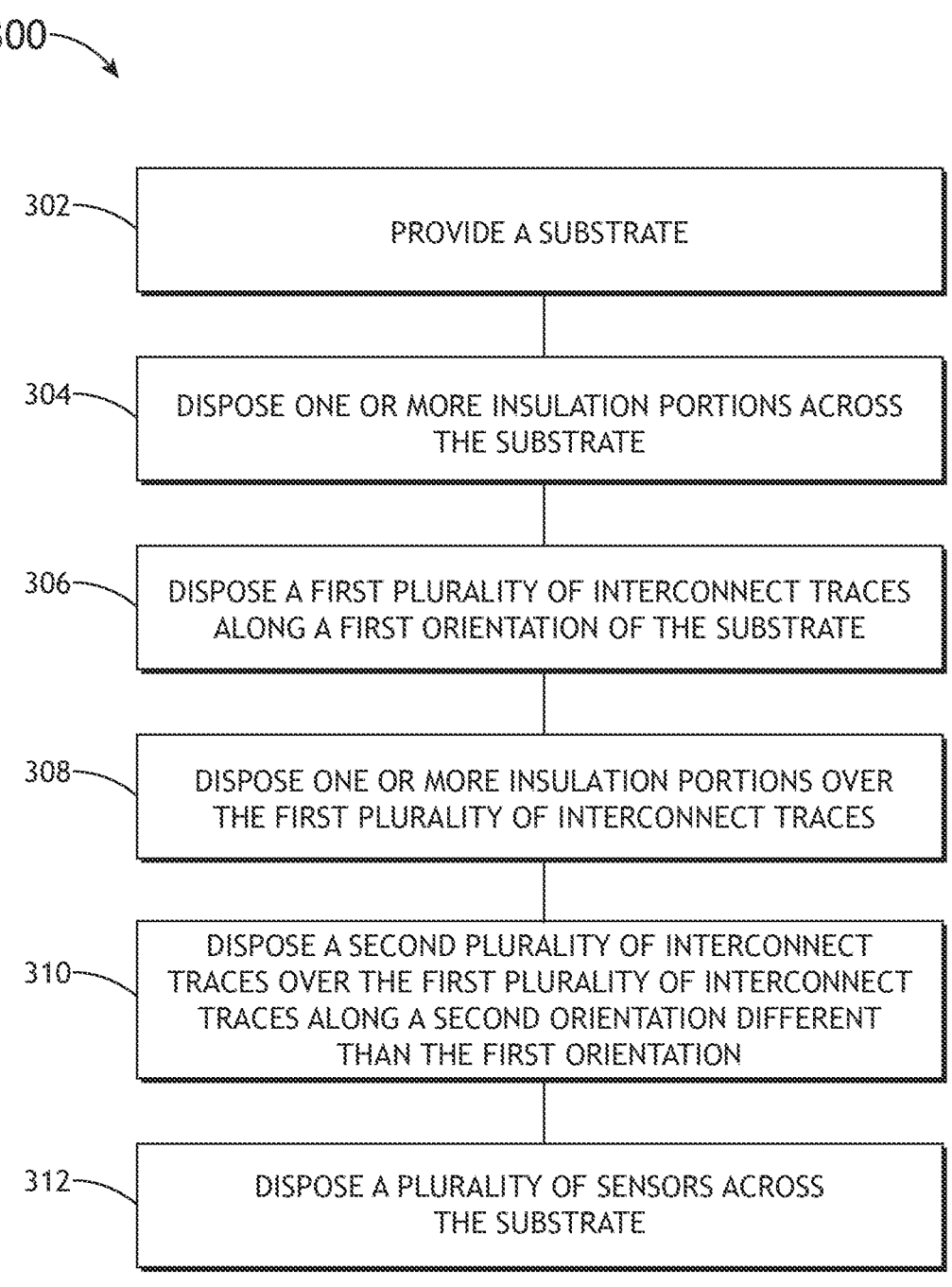

302 —— PROVIDE A SUBSTRATE

304 —— DISPOSE ONE OR MORE INSULATION PORTIONS ACROSS THE SUBSTRATE

306 —— DISPOSE A FIRST PLURALITY OF INTERCONNECT TRACES ALONG A FIRST ORIENTATION OF THE SUBSTRATE

308 —— DISPOSE ONE OR MORE INSULATION PORTIONS OVER THE FIRST PLURALITY OF INTERCONNECT TRACES

310 —— DISPOSE A SECOND PLURALITY OF INTERCONNECT TRACES OVER THE FIRST PLURALITY OF INTERCONNECT TRACES ALONG A SECOND ORIENTATION DIFFERENT THAN THE FIRST ORIENTATION

312 —— DISPOSE A PLURALITY OF SENSORS ACROSS THE SUBSTRATE

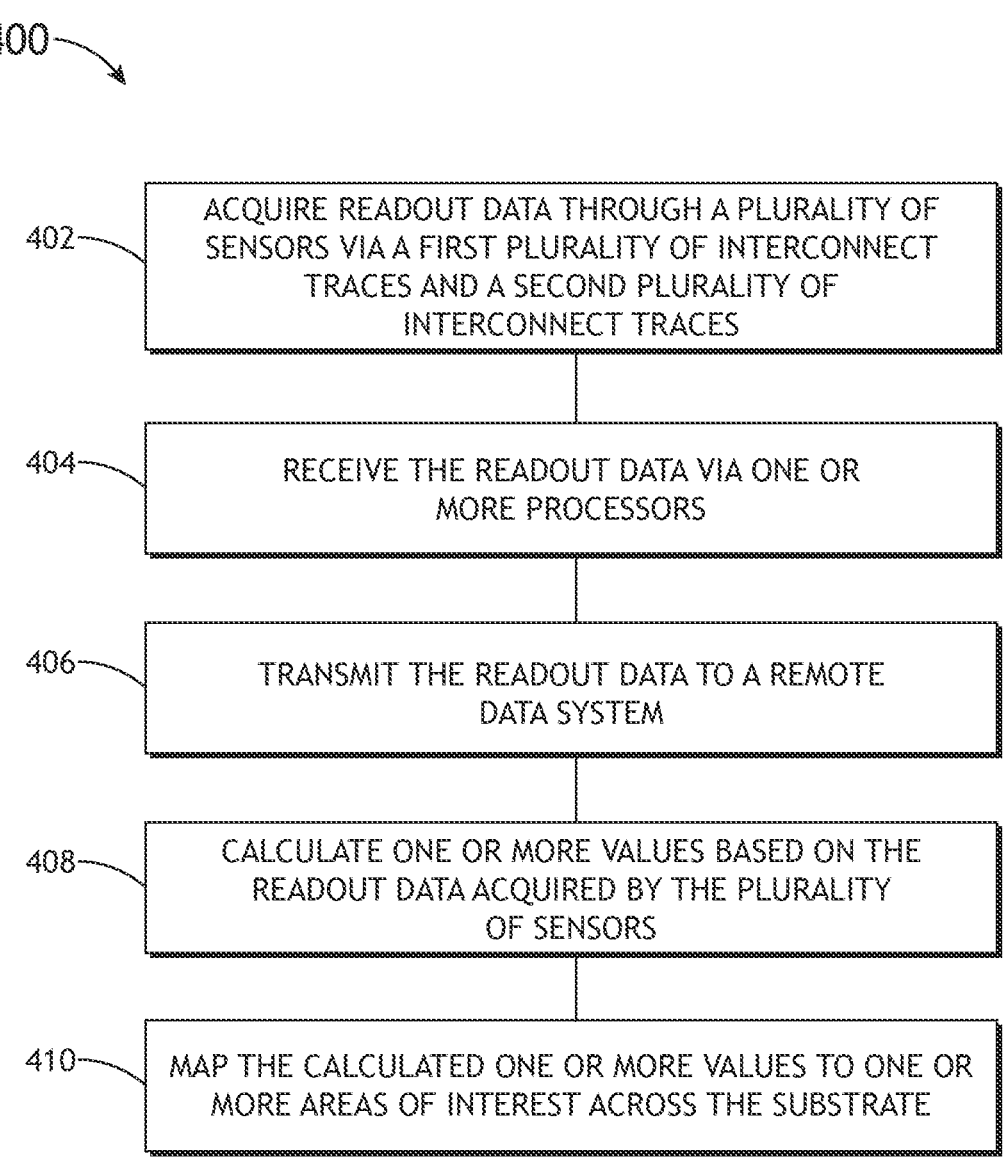

402 — ACQUIRE READOUT DATA THROUGH A PLURALITY OF SENSORS VIA A FIRST PLURALITY OF INTERCONNECT TRACES AND A SECOND PLURALITY OF INTERCONNECT TRACES

404 — RECEIVE THE READOUT DATA VIA ONE OR MORE PROCESSORS

406 — TRANSMIT THE READOUT DATA TO A REMOTE DATA SYSTEM

408 — CALCULATE ONE OR MORE VALUES BASED ON THE READOUT DATA ACQUIRED BY THE PLURALITY OF SENSORS

410 — MAP THE CALCULATED ONE OR MORE VALUES TO ONE OR MORE AREAS OF INTEREST ACROSS THE SUBSTRATE

FIG.4

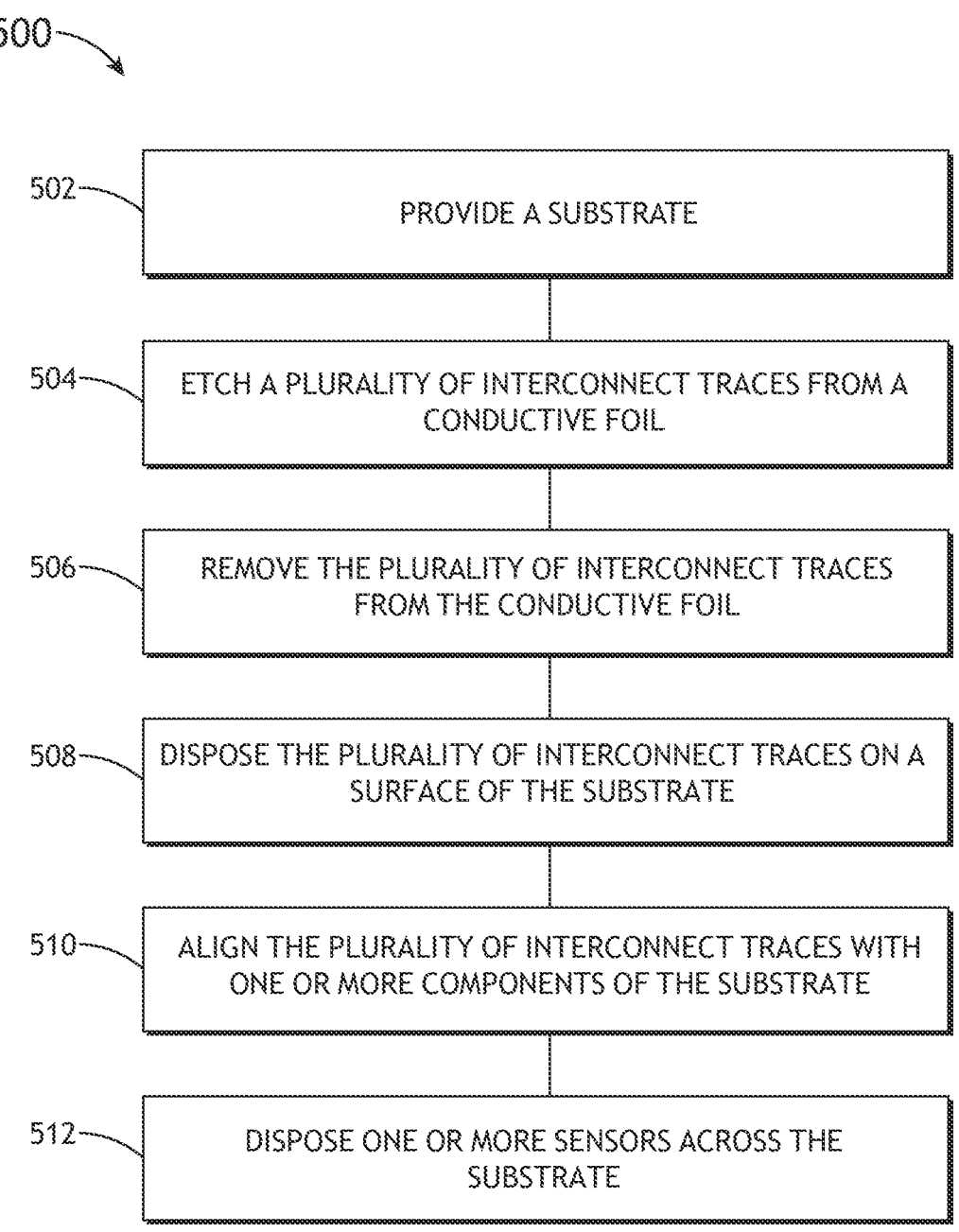

500

502 — PROVIDE A SUBSTRATE

504 — ETCH A PLURALITY OF INTERCONNECT TRACES FROM A CONDUCTIVE FOIL

506 — REMOVE THE PLURALITY OF INTERCONNECT TRACES FROM THE CONDUCTIVE FOIL

508 — DISPOSE THE PLURALITY OF INTERCONNECT TRACES ON A SURFACE OF THE SUBSTRATE

510 — ALIGN THE PLURALITY OF INTERCONNECT TRACES WITH ONE OR MORE COMPONENTS OF THE SUBSTRATE

512 — DISPOSE ONE OR MORE SENSORS ACROSS THE SUBSTRATE

FIG.5

SENSOR CONFIGURATION FOR PROCESS CONDITION MEASURING DEVICES

CROSS-REFERENCE TO RELATED APPLICATION

The present application claims the benefit under 35 U.S.C. § 119(e) and constitutes a regular (non-provisional) patent application of U.S. Provisional Application Ser. No. 63/124,031, filed Dec. 10, 2020, entitled IMPROVEMENTS TO INFORMATION DENSITY AND SPATIAL OPTIMIZATION OF PROCESS CONDITION MEASUREMENT DEVICE, naming Farhat A. Quli, Andrew Nguyen, James Richard Bella, and Earl Jensen as inventors, which is incorporated herein by reference in the entirety.

TECHNICAL FIELD

The present disclosure relates generally to process condition measurement devices used in semiconductor device manufacture, more particularly, the configuration of sensors for process condition measuring devices.

BACKGROUND

Fabrication of semiconductor devices may typically require hundreds or thousands of processing steps to form a functioning device. Over the course of these processing steps, various characterization measurements (e.g., inspection and/or metrology measurements) may be performed to identify defects and/or monitor various parameters on the devices. Electrical testing may be performed instead of or in addition to the various characterization measurements to verify or assess the functionality of the device. Currently, in situ wafer temperature measurement systems use devices that capture the effect of the plasma etch process environment on production wafers. These devices have high sensor density, which enables across-wafer temperature monitoring. In general, the sensors are configured to be fixed in standard locations on a process conditioning measuring device and are not easily reconfigurable. Typically, an entirely new design would be created if the sensors needed to be reconfigured. Therefore, it would be desirable to provide a system and method that cure the shortfalls of the previous approaches identified above.

SUMMARY

A process condition measurement apparatus is disclosed, in accordance with one or more embodiments of the present disclosure. In one illustrative embodiment, the apparatus may include a substrate. In another illustrative embodiment, the apparatus may include one or more insulation portions disposed on the substrate. In another illustrative embodiment, the apparatus may include a first plurality of interconnect traces disposed on the substrate. In another illustrative embodiment, the apparatus may include a second plurality of interconnect traces disposed on the substrate and over the first plurality of interconnect traces. In another illustrative embodiment, the apparatus may include one or more insulation portions where the one or more insulation portions are configured over the first plurality of interconnect traces. The first plurality of interconnect traces and the second plurality of interconnect traces may intersect at a plurality of locations to form a matrix of interconnect junctions across one or more locations of the substrate. In another illustrative embodiment, the apparatus may include a plurality of sensors. A respective sensor may electrically couple to a respective trace of the first plurality of interconnect traces and a respective trace of the second plurality of interconnect traces. The respective sensor may be individually readable by addressing the respective trace of the first plurality of interconnect traces and the respective trace of the second plurality of interconnect traces.

A method is disclosed, in accordance with one or more embodiments of the present disclosure. In one illustrative embodiment, the method may include, but is not limited to, providing a substrate. In another illustrative embodiment, the method may include, but is not limited to, depositing one or more insulation portions on the substrate. In another illustrative embodiment, the method may include, but is not limited to, depositing a first plurality of interconnect traces on the substrate. In another illustrative embodiment, the method may include, but is not limited to, depositing a second plurality of interconnect traces on the substrate and over the first plurality of interconnect traces. The first plurality of interconnect traces and the second plurality of interconnect traces may intersect at a plurality of locations to form a matrix of interconnect junctions across one or more locations of the substrate. In another illustrative embodiment, the method may include, but is not limited to, disposing a plurality of sensors on the substrate. A respective sensor may electrically couple to a respective trace of the first plurality of interconnect traces and a respective trace of the second plurality of interconnect traces. The respective sensor may be individually readable by addressing the respective trace of the first plurality of interconnect traces and the respective trace of the second plurality of interconnect traces.

A process condition measurement apparatus is disclosed, in accordance with one or more embodiments of the present disclosure. In one illustrative embodiment, the apparatus may include a substrate. In another illustrative embodiment, the apparatus may include a network of interconnect traces, where the network of interconnect traces are etched out of a sheet of conductive foil. The network of interconnect traces may be configured to mechanically couple to the substrate. In another illustrative embodiment, the apparatus may include a plurality of sensors. A respective sensor may electrically couple to a respective trace of the network of interconnect traces. The respective sensor may be individually readable by addressing the respective trace of the network of interconnect traces.

It is to be understood that both the foregoing general description and the following detailed description are exemplary and explanatory only and are not necessarily restrictive of the invention as claimed. The accompanying drawings, which are incorporated in and constitute a part of the specification, illustrative embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3 illustrates a flowchart depicting a method for forming a matrix of interconnects and a plurality of sensors across a substrate, in accordance with one or more embodiments of the present disclosure;

FIG. 4 illustrates a flowchart depicting a method for configuring a plurality of sensors on a substrate, in accordance with one or more embodiments of the present disclosure.

FIG. 5 illustrates a flowchart depicting a method for forming a plurality of interconnect traces across a substrate, in accordance with one or more embodiments of the present disclosure;

DETAILED DESCRIPTION

Figure 1A:
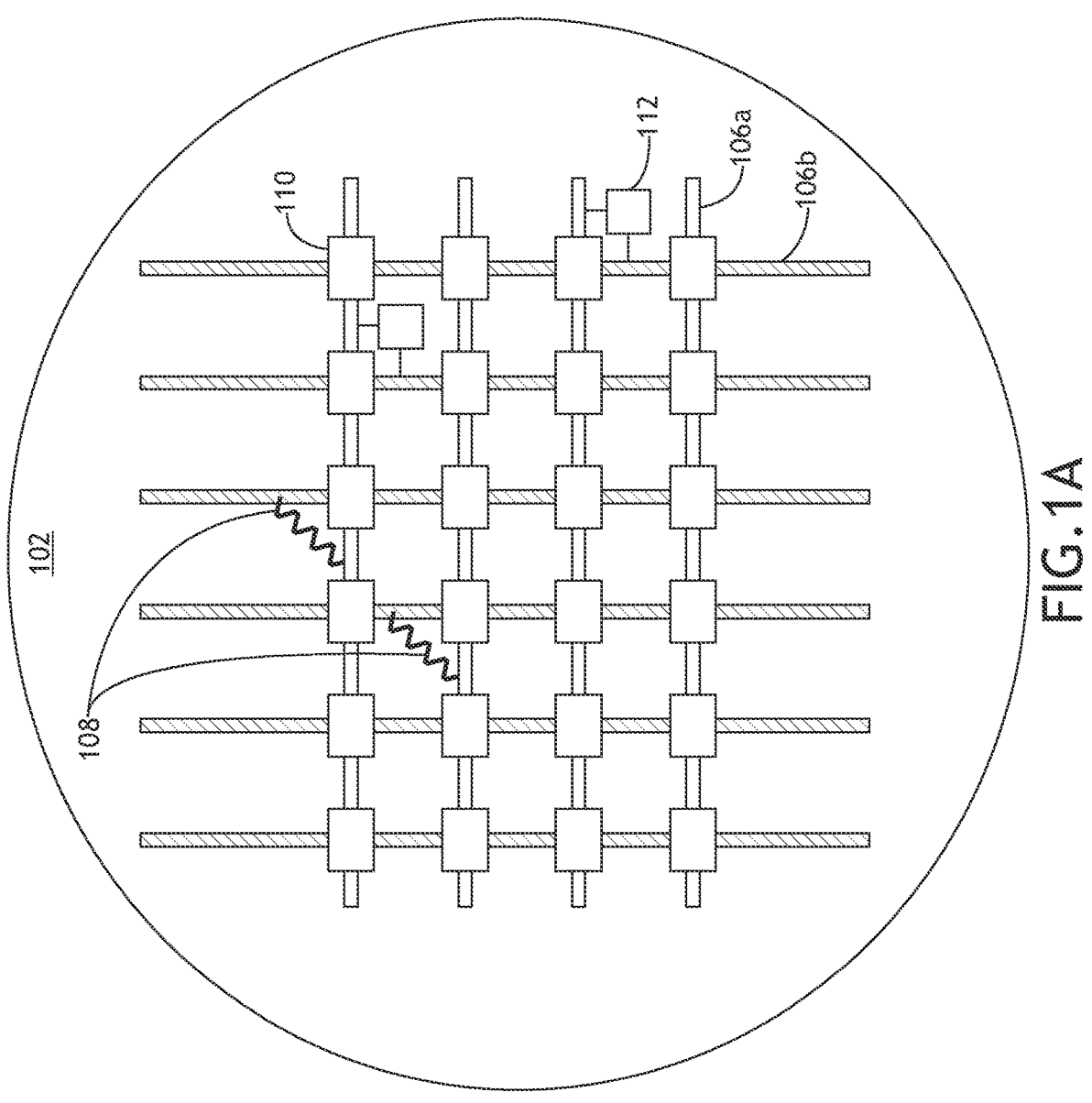
FIG. 1A illustrates a substrate including a matrix of interconnects disposed on the substrate, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Referring generally to FIGS. 1-7D, a process condition measuring device and method is described, in accordance with one or more embodiments of the present disclosure.

Embodiments of the present disclosure are directed to a process condition measuring device. For example, the process condition measuring device may include one or more sensors disposed across the process condition measuring device. In general, the one or more sensors are configured to be fixed in standard locations on the process conditioning measuring device and are not easily reconfigurable. Typically, an entirely new design would be created if the sensors needed to be reconfigured. These standard, fixed locations are not always optimal for customer applications. As such, it would be desirable to provide a device and method that optimizes the spatial density and sensor locations for the process condition measuring device.

In embodiments, a process condition measuring device having optimal spatial density may include one or more sensors at optimal locations across the process condition measuring device. For example, the process condition measuring device may be configured to optimize the one or more sensor locations based on a customer request. By way of another example, the process condition measuring device may be configured to optimize the one or more sensor locations based on certain environmental conditions such as chuck heating zones, metrology points (e.g., pyrometer or other in-situ probe locations), or subsequent metrology (e.g., film thickness or the like).

In embodiments, a process condition measuring device may be configured to dispose a first and second plurality of interconnect traces onto the substrate device. For example, the second plurality of interconnect traces may be disposed over the first plurality of interconnect traces creating intersects at a plurality of locations to form a matrix of interconnect junctions across the substrate. By way of another example, the process condition measuring device may be configured to dispose one or more sensors at one or more intersections of the interconnects.

In additional embodiments, the one or more sensors and the plurality of interconnect traces may be exposed to temperatures exceeding 500 degrees Celsius. In general, interconnect traces have been formed from electrically conductive materials (e.g., aluminum, or the like) to electrically couple components on a substrate. When exposed to high operating temperatures, the thermal expansion of the conducting wires far exceeds that of the Silicon substrate. The mismatch of the thermal expansion between the interconnect traces and the substrate can lead to high stress causing film reliability issues. In addition, electrical conducting materials suffer degradation through oxidation at elevated temperatures and require surface passivation to prevent excessive material loss. Therefore, a method of fabrication of the one or more sensors and the plurality of interconnect traces may include, but is not limited to, materials that are compatible with the substrate to cure the one or more shortfalls of using electrical conducting materials identified above.

FIG. 1A illustrates a substrate 102 including a matrix of interconnect traces 106a, 106b disposed on the substrate 102, in accordance with one or more embodiments of the present disclosure. In embodiments, the substrate 102 may include one or more insulation portions 110, a first plurality of interconnect traces 106a, a second plurality of interconnect traces 106b, and a plurality of sensors 104. It is noted that the formation of the plurality of sensors 104, or the plurality of interconnects 106a, 106b may include, but is not limited to, one or more additive manufacturing processes. For example, the plurality of sensors 104 and/or interconnects 106a, 106b may be formed on the substrate 102 using 3D printing, ink-jet printing, aerosol printing, screen printing, a thin film process, or the like.

In embodiments, the substrate 102 may include one or more insulation portions 110 deposited across the surface of the substrate 102. As shown in FIG. 1C, the one or more insulation portions 110 may be positioned beneath an intersection of the plurality of interconnects 106a, 106b. As shown in FIG. 1D, the one or more insulation portions 110 may be positioned between an intersection of the plurality of interconnects 106a, 106b. For example, one or more intersecting locations of the first plurality of interconnect traces 106a and the second plurality of interconnect traces 106b form a matrix of interconnect junctions. In embodiments, a plurality of sensors 104 are disposed across the substrate 102. For example, the plurality of sensors 104 may include one or more printed sensors 108 at a respective intersection point of a respective trace of the first plurality of interconnect traces 106a and a respective trace of the second plurality of interconnect traces 106b. By way of another example, the plurality of sensors 104 may include one or more discreet sensors 112 assembled at the one or more interconnect junctions. The plurality of sensors 104 may be configured at any interconnect junction. It is noted that the plurality of interconnect traces 106a, 106b may be fabricated on the substrate 102 independent of the plurality of sensors 104. It is further noted that the plurality of sensors 104 may be coupled to the plurality of interconnect traces 106a, 106b prior to being fabricated on the substrate 102.

In embodiments, the process condition measuring device 100 may be used to measure the processing conditions of semiconductor fabrication equipment. For example, the device 100 may be used to measure process conditions that a sample (e.g., wafer) undergoes during processing. In embodiments, a plurality of sensors 104 are disposed on the substrate 102 at one or more locations across the substrate 102. In embodiments, the plurality of sensors 104 are configured to acquire one or more measurement parameters at the one or more locations across the substrate 102. In embodiments, the plurality of sensors 104 may be coupled to one or more components (e.g., one or more processors, memory, or communication circuitry) and configured to transmit measurement data to a remote data system 110.

It is noted that the plurality of sensors 104 may include any discrete measurement device known in the art including, but not limited to, one or more temperature sensors, one or more pressure sensors, one or more radiation sensors, one or more chemical sensors, or a combination thereof. For example, the plurality of sensors 104 may include one or more temperature sensors configured to acquire one or more parameters indicative of temperature. For instance, the one or more temperature sensors may include, but are not limited to, one or more thermocouple (TC) devices (e.g., thermoelectric junction), one or more resistance temperature devices (RTDs) (e.g., thin film RTD), or the like. In another instance, in the case of pressure measurements, the plurality of sensors 104 may include, but are not limited to, a piezoelectric sensor, a capacitive sensor, an optical sensor, a potentiometric sensor or the like. In another instance, in the case of radiation measurements, the plurality of sensors 104 may include, but are not limited to, one or more light detectors (e.g., photovoltaic cell, photoresistor, and the like) or other radiation detectors (e.g., solid state detector). In another instance, in the case of chemical measurements, the plurality sensors 104 may include, but are not limited to, one or more chemiresistors, gas sensors, pH sensors, or the like.

Figure 1B:
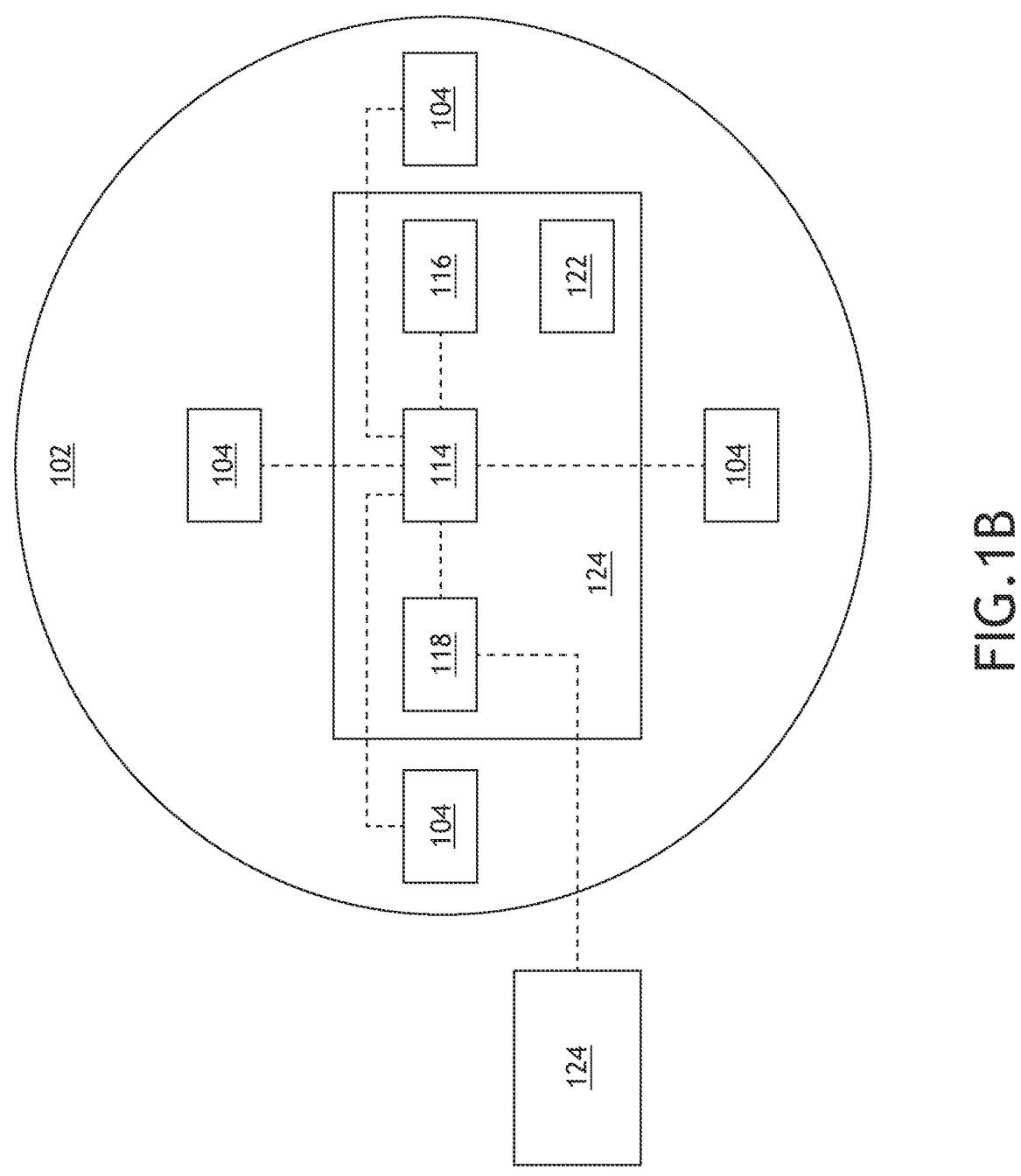
FIG. 1B illustrates a simplified block diagram of one or more electronic components of the substrate, in accordance with one or more embodiments of the present disclosure.
Figure 1C:
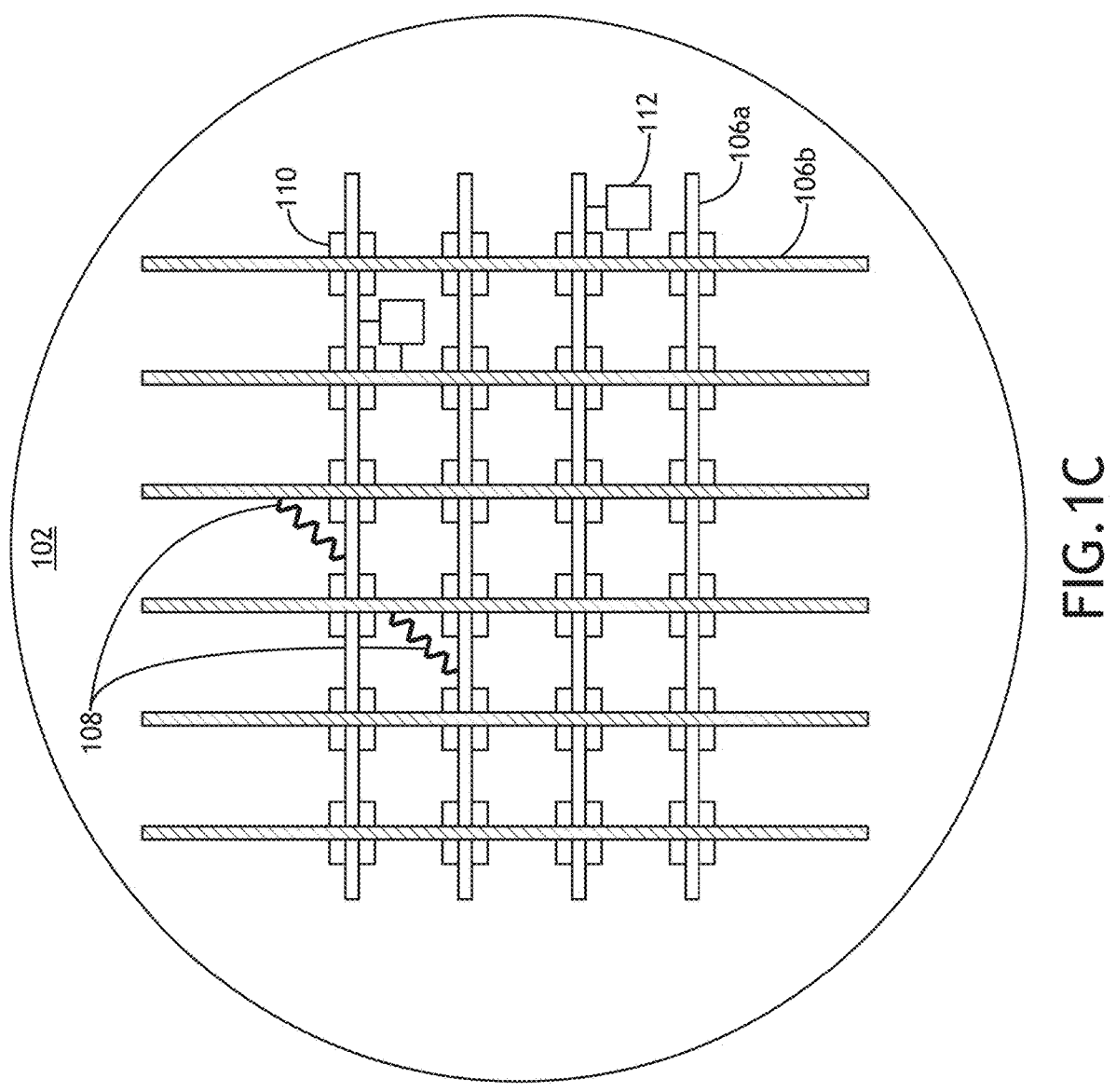
FIG. 1C illustrates a substrate including a matrix of interconnects disposed on the substrate with insulation portions beneath the interconnects, in accordance with one or more embodiments of the present disclosure.
Figure 1D:
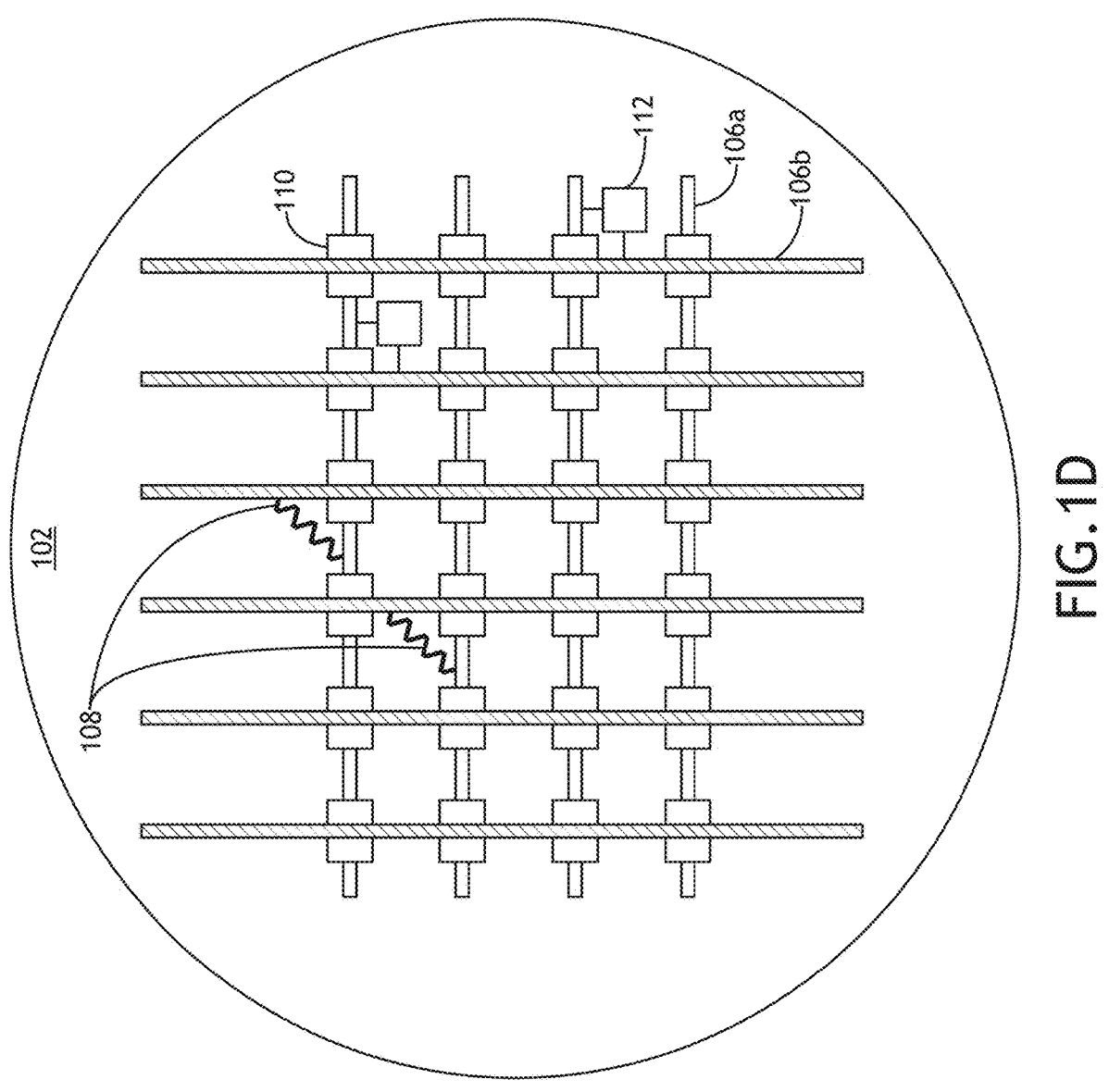
FIG. 1D illustrates a substrate including a matrix of interconnects disposed on the substrate with insulation portions between the interconnects, in accordance with one or more embodiments of the present disclosure.

FIG. 1B illustrates a simplified block diagram of one or more electronic components coupled to the substrate 102, in accordance with one or more embodiments of the present disclosure. In embodiments, a controller 124 may be communicatively coupled to the substrate 102. The controller 124 may include one or more electronic components. In embodiments, the one or more electronic components include a power source 122. The controller 124 may include any type of power source known in the art. For example, the controller 124 may include one or more batteries.

In embodiments, the one or more electronic components of the controller 124 may include one or more processors

114. For example, the one or more processors 114 may be configured to receive one or more measurement parameters from the plurality of sensors 104. In embodiments, the one or more electronic components of the controller 124 include communication circuitry 118. In embodiments, the one or more electronic components of the controller 124 include a memory medium 116 (e.g., memory) for storing program instructions for the one or more processors 114 and/or the measurement parameters received from the plurality of sensors 104.

It is noted herein that the one or more electronic components of the controller 124 may include any electronic component known in the art including, but not limited to, an analog-to-digital converter.

In embodiments, the controller 124 is communicatively coupled to a remote data system 110. In embodiments, the controller 124 transmits a plurality of measurement parameters to the remote data system 110 via the communication circuitry 118.

The one or more processors 114 may include any processor or processing element known in the art. For purposes of the present disclosure, the term "processor" or "processing element" may be broadly defined to encompass any device having one or more processing or logic elements. In this sense, the one or more processors 114 may include any device configured to execute algorithms and/or instructions (e.g., program instructions stored in memory). It should be recognized that the steps described throughout the present disclosure may be carried out by a single processor or, alternatively, multiple processors.

The memory medium 116 may include any storage medium known in the art suitable for storing program instructions executable by the associated one or more processors 114. For example, the memory medium 116 may include a non-transitory memory medium. By way of another example, the memory medium 116 may include, but is not limited to, a read-only memory (ROM), a random-access memory (RAM), a solid-state drive, and the like. It is further noted that memory medium 116 may be housed in a common controller housing with the one or more processors 114. In embodiments, the memory medium 116 is located remotely with respect to the physical location of the one or more processors 114. For instance, the one or more processors 114 may access a remote memory (e.g., server), accessible through a network (e.g., internet, intranet, and the like).

In embodiments, one or more components within the controller 124 may be communicatively coupled to the plurality of sensors 104. For example, the components of controller 124 may be coupled to the plurality of sensors 104 via one or more wired connections (e.g., wires, interconnects, or the like). In embodiments, the one or more electronic components of the controller 124 may be configured to acquire one or more measurement parameters from the plurality of sensors 104. For instance, the one or more processors 114 of the controller 124 may acquire one or more measurement parameters from the plurality of sensors 104. The one or more measurement parameters may include, but are not limited to, voltage (or other signals) from a temperature sensor (e.g., thermocouple), voltage (or other signals) from a pressure sensor, voltage (or other signals) from a radiation sensor, voltage (or other signals) from a chemical sensor, and the like.

It is noted herein that the substrate 102 may include surface types such as, but not limited to, silicon wafer, quartz, glass, silicon nitride or the like.

Figure 2:
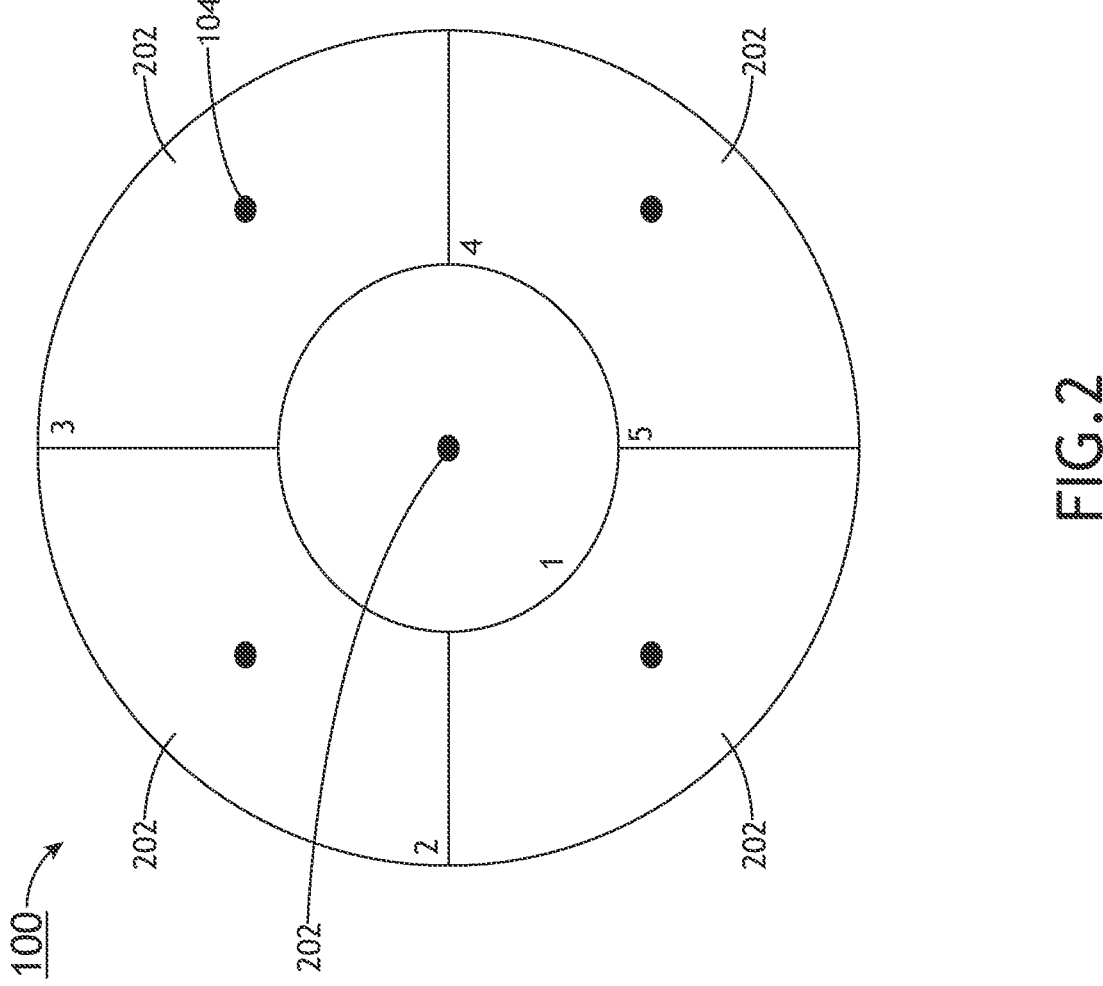
FIG. 2 illustrates a process condition measuring device including a plurality of sensors configured in one or more locations across the device using the matrix of interconnect traces, in accordance with one or more embodiments of the present disclosure.

FIG. 2 illustrates a process condition measuring device 100 including a plurality of sensors 104 configured in one or more locations across the device using the matrix of interconnect traces 106a, 106b, in accordance with one or more embodiments of the present disclosure. The device 100 may include a substrate 102. In embodiments, the plurality of sensors 104 may be configured at locations according to a set of environment conditions such as a plurality of chuck heating zones 202. For example, the matrix illustrated in FIG. 1A may be configured to provide the pattern of the plurality of sensors 104 illustrated in FIG. 2. The substrate 102 may include an optimal configuration of sensors (e.g., number, location, etc.). It is noted herein that the plurality of sensors 104 are not limited to a configuration according to a plurality of chuck heating zones 202, but may also be configured according to a customer request, other metrology points (e.g., pyrometer) or other in-situ probe locations, or subsequent metrology (e.g., film thickness).

FIG. 3 illustrates a flowchart depicting a method 300 for forming a matrix of interconnect traces 106a, 106b and a plurality of sensors 104 on a substrate 102, in accordance with one or more embodiments of the present disclosure. It is noted herein that the steps of method 300 may be implemented all or in part by the device 100. It is further recognized, however, that the method 300 is not limited to the device 100 in that additional or alternative system-level embodiments may carry out all or part of the steps of method 300.

In a step 302, the process condition measuring device 100 may provide a substrate 102. For example, the substrate 102 may include any substrate known in the art of semiconductor processing. In embodiments, the substrate 102 is a wafer. For example, the substrate 102 may include, but is not limited to, a semiconductor wafer (e.g., silicon wafer). The substrate 102 may be formed of any material known in the art including, but not limited to, silicon, glass, ceramic, gallium arsenide, carbide, silicon nitride, quartz, or the like. It is noted herein that the substrate 102 may take on the same, or similar, size and shape as a standard substrate processed by a semiconductor device processing system. Further, it is noted that the substrate 102 may include a layered substrate (e.g., a substrate with at least a top layer and a bottom layer).

In a step 304, one or more insulation portions 110 are disposed across the substrate 102.

In a step 306, a first plurality of interconnect traces 106a is disposed on the substrate 102. For example, the first plurality of interconnect traces 106a may be disposed via an additive process (e.g., 3D printed, ink-jet printed, aerosol printed, screen printed, thin film process, or the like) onto the substrate 102 (e.g., non-conductive surface) in customizable locations and orientations. For instance, the first plurality of interconnect traces 106a may be disposed onto the substrate 102 along a first orientation.

In a step 308, one or more insulation portions 110 are disposed over the first plurality of interconnect traces 106a. The one or more insulation portions 110 may be disposed at locations across the substrate 102 including, but not limited to, the intersection points between the first plurality of interconnect traces 106a and the second plurality of interconnect traces 106b.

In a step 310, a second plurality of interconnect traces 106b is disposed on the substrate 102. For example, the second plurality of interconnect traces 106b may be disposed via an additive process (e.g., 3D printed, ink-jet printed, aerosol printed, screen printed, thin film process, or the like) onto the substrate 102 (e.g., non-conductive surface) in customizable locations and orientations. For instance, the second plurality of interconnect traces 106b may be disposed over the first plurality of interconnect traces 106a along a second orientation different than the first orientation.

In embodiments, one or more intersecting locations of the first plurality of interconnect traces 106a and the second plurality of interconnect traces 106b form a matrix of interconnect junctions. For example, matrix of interconnect junctions may be formed across one or more locations of the substrate 102. By way of another example, the interconnect junctions may be formed over the one or more insulation portions 110.

In a step 312, a plurality of sensors 104 are disposed across the substrate 102. For example, the plurality of sensors 104 may be disposed via an additive process (e.g., 3D printed, ink-jet printed, aerosol printed, screen printed, thin film process, or the like). By way of another example, the plurality of sensors 104 may include one or more printed sensors 108 at a respective intersection point of a respective trace of the first plurality of interconnect traces 106a and a respective trace of the second plurality of interconnect traces 106b. By way of another example, the plurality of sensors 104 may include one or more discreet sensors 112 assembled at the one or more interconnect junctions. The plurality of sensors 104 may be configured at any interconnect junction. It is noted that the plurality of interconnect traces 106a, 106b may be fabricated on the substrate 102 independent of the plurality of sensors 104. It is further noted that the plurality of sensors 104 may be coupled to the plurality of interconnect traces 106a, 106b prior to being fabricated on the substrate 102.

FIG. 4 illustrates a flowchart depicting a method 400 for configuring a plurality of sensors on a substrate, in accordance with one or more embodiments of the present disclosure. It is noted herein that the steps of method 400 may be implemented all or in part by the process condition measuring device 100. It is further recognized, however, that the method 400 is not limited to the device 100 in that additional or alternative system-level embodiments may carry out all or part of the steps of method 400.

In a step 402, a plurality of sensors 104 acquire readout data via a plurality of interconnect traces 106a, 106b. For example, the plurality of sensors 104 may be electrically coupled to a respective trace of the first plurality of interconnect traces 106a and a respective trace of the second plurality of interconnect traces 106b. By way of another example, the plurality of sensors 104 may be individually readable by addressing the respective trace of the first plurality of interconnect traces 106a and the respective trace of the second plurality of interconnect traces 106b.

In a step 404, one or more processors 114 are configured to receive the readout data from the plurality of sensors 104.

In a step 406, the one or more processors 114 transmit the readout data to a remote data system 110.

In a step 408, the one or more processors 114 calculate one or more values based on the readout data acquired by the plurality of sensors 104.

In a step 410, the calculated one or more values are utilized to map to one or more areas of interest across the substrate 102. For example, the plurality of sensors 104 may be configured to the one or more areas of interest across the substrate 102.

FIG. 5 illustrates a flowchart depicting a method 500 for configuring a plurality of sensors on a substrate, in accordance with one or more embodiments of the present disclosure. It is noted herein that the steps of method 500 may be implemented all or in part by the process condition measuring device 100. It is further recognized, however, that the method 500 is not limited to the device 100 in that additional or alternative system-level embodiments may carry out all or part of the steps of method 500.

In a step 502, the process condition measuring device 100 may provide a substrate 102. For example, the substrate 102 may include any substrate known in the art of semiconductor processing. In embodiments, the substrate 102 is a wafer. For example, the substrate 102 may include, but is not limited to, a semiconductor wafer (e.g., silicon wafer). The substrate 102 may be formed of any material known in the art including, but not limited to, silicon, glass, ceramic, gallium arsenide, carbide, silicon nitride, quartz, or the like. It is noted herein that the substrate 102 may take on the same, or similar, size and shape as a standard substrate processed by a semiconductor device processing system. Further, it is noted that the substrate 102 may include a layered substrate (e.g., a substrate with at least a top layer and a bottom layer).

In a step 504, a plurality of interconnect traces 606 may be etched from a conductive foil. In embodiments, the plurality of interconnect traces 606 may remain attached to the foil via one or more tabs 602. Additionally, the material of the foil may be chosen to match the thermal expansion of the substrate 102. For example, the one or more interconnect traces 606 may be etched from, but not limited to, a sheet of Kovar foil. By way of another example, a silicon substrate may utilize foil made of Kovar to minimize the distortion of the plurality of interconnect traces 606 as the substrate 102 approaches higher temperatures.

In a step 506, the plurality of interconnect traces may be removed from the conductive foil. For example, the plurality of interconnect traces 606 may be subsequently removed (e.g., by manual cutting, laser cutting, or any other method known in the art).

In a step 508, the plurality of interconnect traces 606 may be disposed on a surface of the substrate 102. In embodiments, the attachment method of the foil to the substrate 102 may be configured to limit the amount of fixed contact between the substrate 102 and the plurality of interconnect traces 606. For example, the interconnect traces 606 may be anchored to the substrate 102 at given interval lengths or only at the two ends of the connection. This may be accomplished by using an adhesive every given length (e.g., every two inches) or by building small "lids". For example, these "lids" may be adhered to the wafer to avoid having to physically tie the plurality of interconnect traces 606 directly to the substrate 102, and may provide a constraint to the plurality of interconnect traces 606 in the x, y, and z directions. It is noted herein that the plurality of interconnect traces 606 are not limited to the attachment method discussed above and may be secured to the substrate 102 through embedding the plurality of interconnect traces 606 in trenches prepared on a top surface of the wafer.

In a step 510, the plurality of interconnect traces 606 may align with one or more components on the substrate 102. For example, one or more visual features may be etched into the plurality of interconnect traces 606 that align with corresponding features on the substrate 102. By way of another example, one or more mechanical shapes may be etched into the plurality of interconnect traces 606 that align with artifacts on the substrate 102 (e.g., etching holes in the plurality of interconnect traces 606 that align with rods or "pillars" on the surface of the substrate 102). By way of another example, one or more grooves may be fabricated into the surface of the substrate 102 that correspond to the position of the plurality of interconnect traces 606 which may be placed into the one or more grooves.

In a step 512, a plurality of sensors 104 are disposed across the substrate 102. For example, the plurality of sensors 104 may be disposed via an additive process (e.g., 3D printed, ink-jet printed, aerosol printed, screen printed, thin film process, or the like). By way of another example, the plurality of sensors 104 may include one or more printed sensors 108 may be disposed on a respective trace of the plurality of interconnect traces 606. By way of another example, the plurality of sensors 104 may include one or more discreet sensors 112. It is noted that the plurality of interconnect traces 606 may be fabricated on the substrate 102 independent of the plurality of sensors 104. It is further noted that the plurality of sensors 104 may be coupled to the plurality of interconnect traces 606 prior to being fabricated on the substrate 102.

Figure 6A:
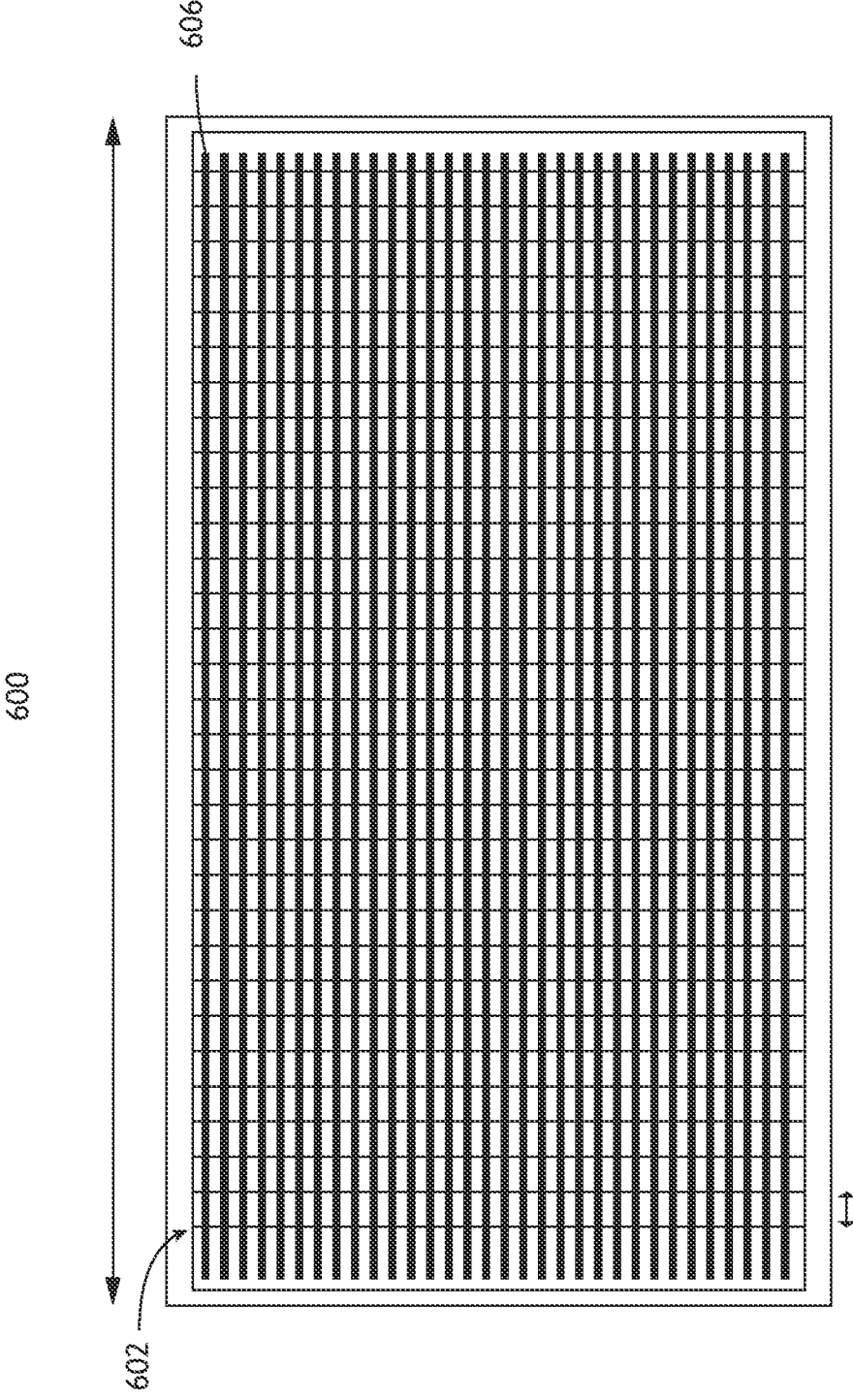
FIG. 6A illustrates a plurality of interconnect traces etched from a foil, in accordance with one or more embodiments of the present disclosure.

FIG. 6A illustrates a plurality of interconnect traces 606 etched from a foil, in accordance with one or more embodiments of the present disclosure. In embodiments, the entire network of the plurality of interconnect traces 606 or a partial network of the plurality interconnect traces 606 may be etched from a sheet of conductive foil. The plurality of interconnect traces 606 may be configured to remain attached to the foil via one or more tabs 602. In embodiments, the one or more tabs 602 may be intermittently separated by a length which is maximized to ease the process of removing the one or more tabs 602.

It is noted herein that the network of interconnect traces 606 may include a complex network of interconnect traces 606. Therefore, it may be undesirable to form this network of interconnect traces 606 by hand with point-to-point wiring. It is further noted that forming the plurality of interconnect traces 606 from the conductive foil allows the plurality of interconnect traces 606 to have complex geometries (e.g., bends, twists, sharp angles, or the like) and features may be etched into the plurality of interconnect traces 606 to help align with the substrate 102.

In embodiments, the material of the conductive foil may be chosen to compliment the material of the substrate 102. For example, the material of the foil may be selected to have a similar thermal expansion as the substrate 102. By way of another example, a Kovar foil may be used in tandem with a silicon substrate 102. It is noted herein that having similar thermal expansion values minimizes the distortion of the interconnects as the substrate 102 reaches temperatures exceeding 500 degrees Celsius.

Figure 6B:
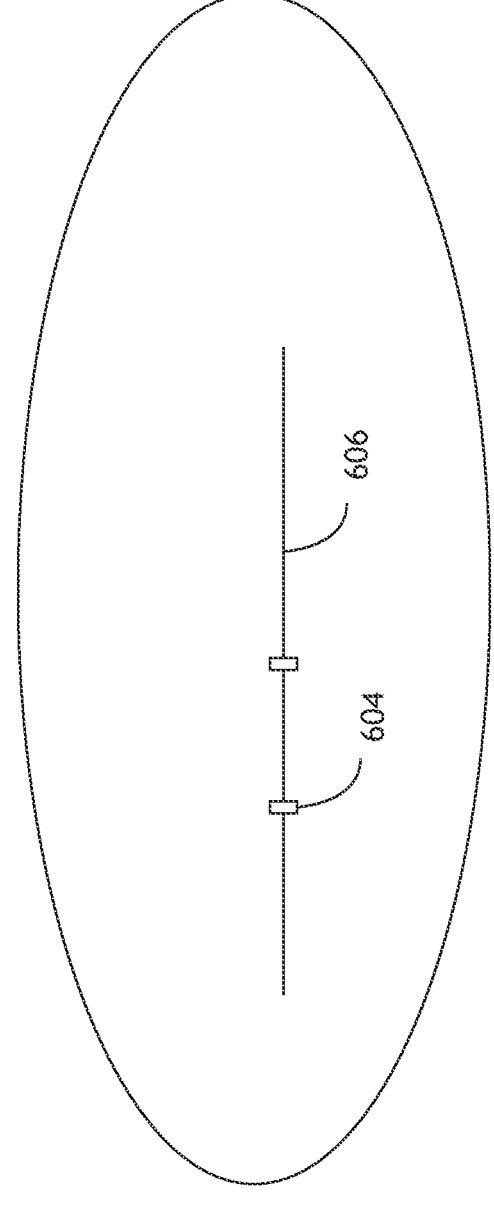
FIG. 6B illustrates a perspective view of a respective trace of the plurality of interconnect traces etched from a foil, in accordance with one or more embodiments of the present disclosure.

FIG. 6B illustrates a perspective view of a respective trace of the plurality of interconnect traces etched from a foil, in accordance with one or more embodiments of the present disclosure.

Figure 7A:
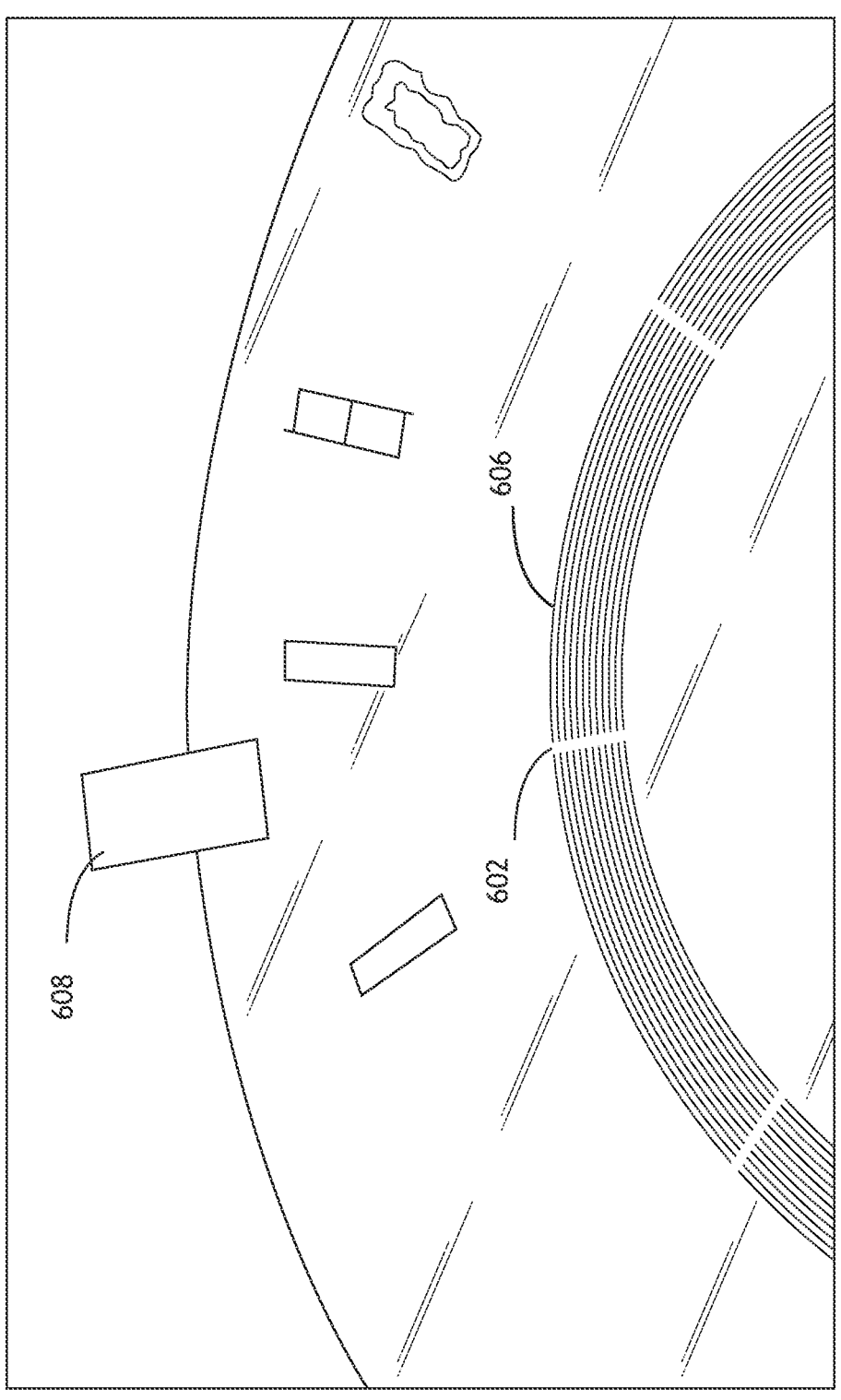
FIG. 7A illustrates a plurality of interconnect traces etched from a foil, in accordance with one or more embodiments of the present disclosure.

FIG. 7A illustrates a plurality of interconnect traces etched from a foil, in accordance with one or more embodiments of the present disclosure.

Figure 7B:
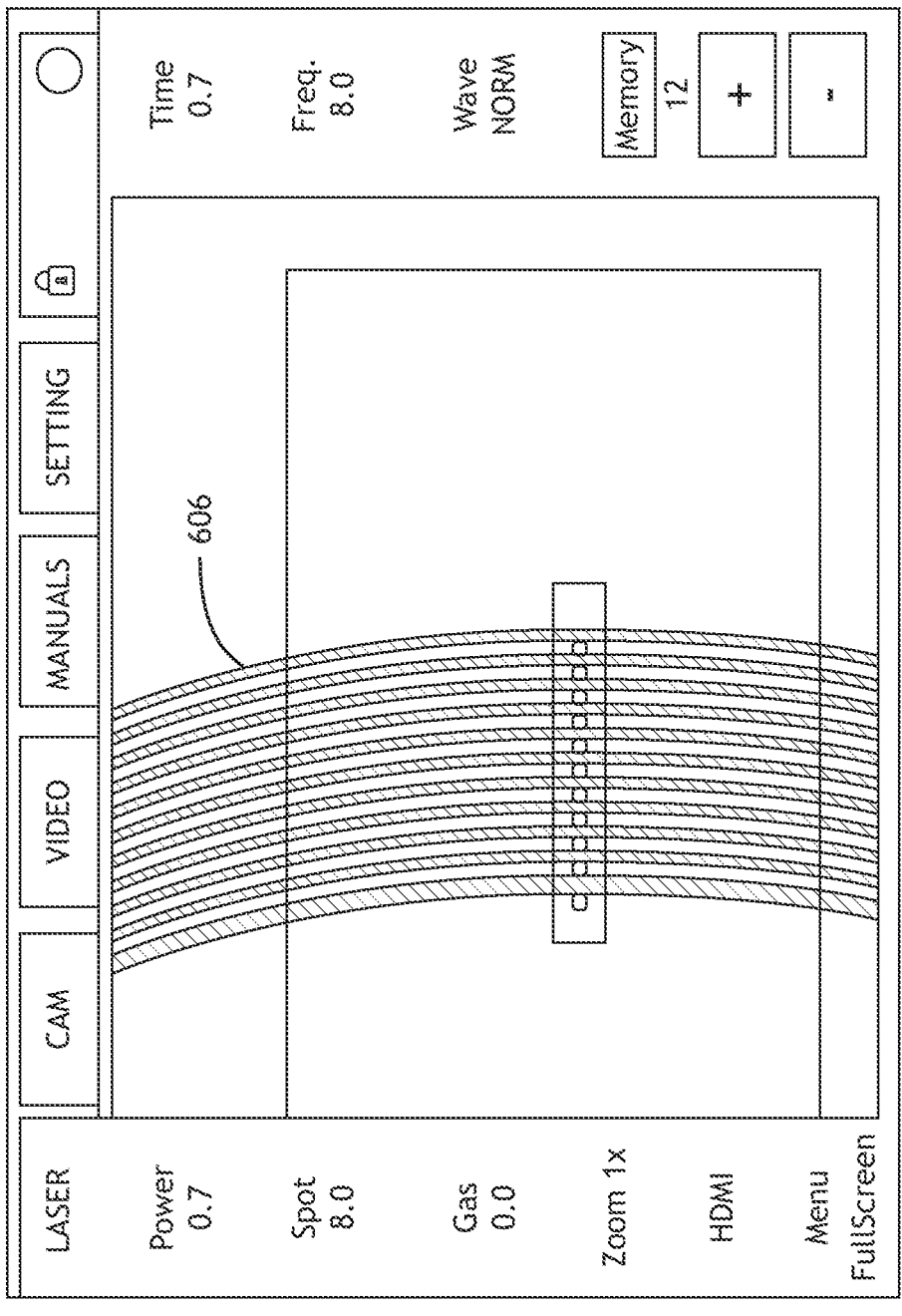
FIG. 7B illustrates a plurality of interconnect traces etched from a foil with the tab removed, in accordance with one or more embodiments of the present disclosure.

FIG. 7B illustrates a plurality of interconnect traces etched from a foil with the tab removed, in accordance with one or more embodiments of the present disclosure. For example, the one or more tabs 602 may be subsequently removed via manual cutting, laser cutting, or any other removal process known in the art, to free the plurality of interconnect traces 606 from the foil.

Figure 7C:
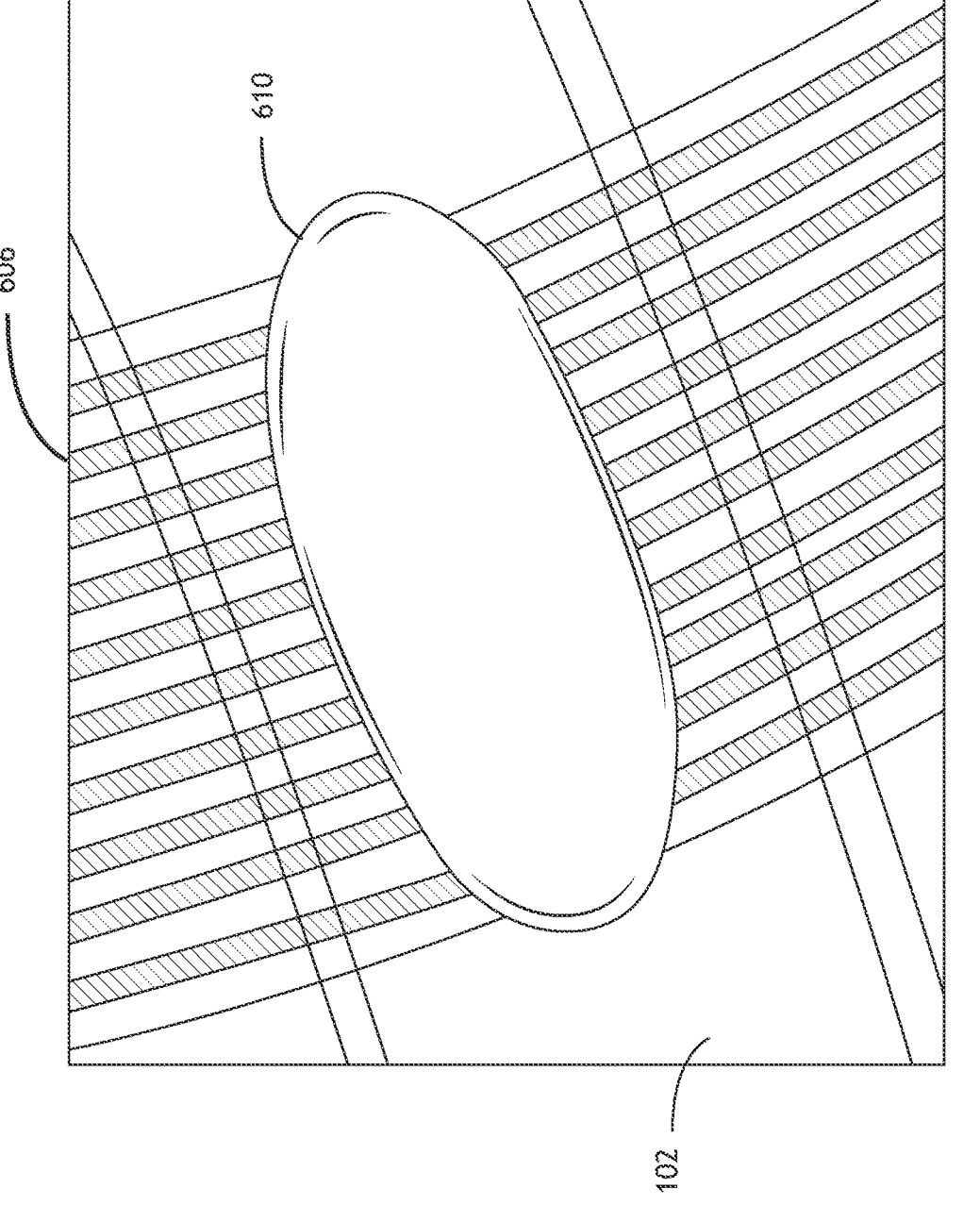
FIG. 7C illustrates a plurality of interconnect traces coupled to the substrate, in accordance with one or more embodiments of the present disclosure.
Figure 7D:
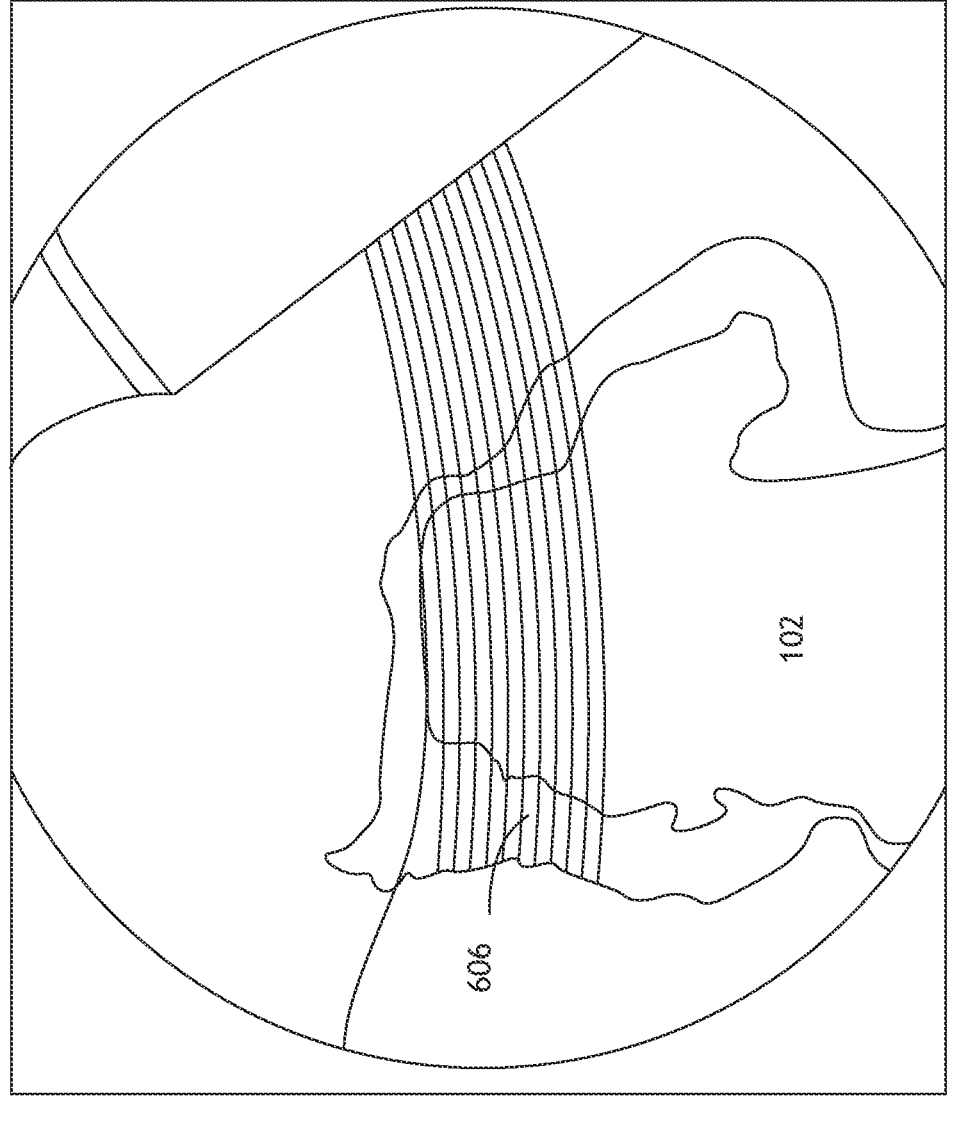
FIG. 7D illustrates a plurality of interconnect traces coupled to the substrate, in accordance with one or more embodiments of the present disclosure.

FIG. 7C-7D illustrate a plurality of interconnect traces coupled to the substrate 102, in accordance with one or more embodiments of the present disclosure.

It is noted herein that the thermo-mechanical properties of the substrate-interconnect structures are affected by the method of attachment between the foil and the substrate 102. A slight mismatch between the substrate 102 and the plurality of interconnect traces 606 can cause large stress and strain values across a long interconnect trace. Therefore, it is desirable to limit the amount of fixed contact between the substrate 102 and the plurality of interconnect traces 606, while allowing free expansion of the plurality of interconnect traces 606 in the vertical direction.

In embodiments, the plurality of interconnect traces 606 may be configured to anchor to the substrate 102 at given interval lengths or at the corresponding ends of the trace. For example, the interconnect traces 606 may be configured to anchor to the substrate 102 via an adhesive 610 that is applied intermittently at a given length (e.g., every two inches). In alternative embodiments, the plurality of interconnect traces 606 may use small "lids". The lids may be configured to adhere to the wafer and provide a constraint to the plurality of interconnect traces 606 in the x, y, and z directions while still allowing for movement so as not to physically tie the interconnect directly to the substrate 102.

It is further noted that alignment of the plurality of interconnect traces 606 with the substrate 102 is critical. For example, one or more visual features may be etched into the plurality of interconnect traces 606 and aligning with one or more features on the substrate 102. By way of another example, one or more mechanical shapes may be etched into the plurality of interconnect traces 606 that align with one or more artifacts (e.g., rods, pillars, or the like) on the substrate 102. By way of another example, one or more grooves may be etched into the surface of the substrate 102 that correspond to the position of the plurality of interconnect traces 606, which are then secured into the one or more grooves.

One skilled in the art will recognize that the herein described components, devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components, devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," "temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A process condition measurement apparatus comprising:

a substrate;

one or more insulation portions disposed on the substrate;

a first plurality of interconnect traces disposed on the substrate;

a second plurality of interconnect traces disposed on the substrate and over the first plurality of interconnect traces, wherein the first plurality of interconnect traces and the second plurality of interconnect traces intersect at a plurality of locations to form a matrix of interconnect junctions across one or more locations of the substrate, wherein at least one of the first plurality of interconnect traces or the second plurality of interconnect traces is anchored to the substrate at intermittent locations along its length, such that at least one of the first plurality of interconnect traces or the second plurality of interconnect traces are not continuously fixed to the substrate;

a plurality of sensors, wherein a respective sensor is electrically coupled to a respective trace of the first plurality of interconnect traces and a respective trace of the second plurality of interconnect traces, wherein the respective sensor is individually readable by addressing the respective trace of the first plurality of interconnect traces and the respective trace of the second plurality of interconnect traces; and one or more discrete sensors located at one or more select interconnect junctions of the matrix of interconnect junctions.

2. The apparatus of claim 1, wherein the location of the plurality of sensors are configurable according to one or more areas of interest.

3. The apparatus of claim 1, wherein the location of the plurality of sensors are configurable according to a set of environment conditions.

4. The apparatus of claim 1, wherein the location of the plurality of sensors are configurable according to one or more heating zones associated with a process tool.

5. The apparatus of claim 1, wherein the one or more insulation portions comprise a plurality of insulation portions, wherein a respective insulation portion is disposed under a respective intersection point of a respective trace of the first plurality of interconnect traces and a respective trace of the second plurality of interconnect traces.

6. The apparatus of claim 5, wherein the one or more insulation portions of the plurality of insulation portions are disposed at the plurality of intersecting locations between the first plurality of interconnect traces and the second plurality of interconnect traces.

7. The apparatus of claim 1, wherein one or more of the plurality of sensors comprises one or more sensors located at one or more interconnect junctions.

8. The apparatus of claim 7, wherein the one or more of the plurality of sensors comprises one or more sensors printed on the substrate at the one or more interconnect junctions.

9. The apparatus of claim 1, wherein the substrate is formed from at least one of silicon, quartz, glass, or silicon nitride.

10. The apparatus of claim 9, wherein the substrate comprises a silicon wafer.

11. The apparatus of claim 1, wherein at least one of the first plurality of interconnects, the second plurality of interconnects, or the plurality of sensors are formed from one or more additive manufacturing processes.

12. The apparatus of claim 11, wherein the one or more additive manufacturing processes comprises at least one of 3-D printing, ink-jet printing, aerosol printing, screen printing, or a thin film process.

13. The apparatus of claim 1, wherein one or more sensors of the plurality of sensors comprise:

at least one of one or more temperature sensors configured to acquire one or more parameters indicative of temperature, one or more pressure sensors configured to acquire one or more parameters indicative of pressure, one or more chemical sensors configured to acquire one or more parameters indicative of a presence of a targeted chemical, or one or more radiation sensors configured to acquire one or more parameters indicative of a presence of radiation.

14. The apparatus of claim 1, further comprising an electronic assembly.

15. The apparatus of claim 14, wherein the electronic assembly comprises:

one or more processors, wherein the one or more processors are configured to acquire readout data from the plurality of sensors via the first plurality of interconnect traces and the second plurality of interconnect traces;

communication circuitry;

memory; and a power source.

16. The apparatus of claim 15, further comprising:

a remote data system communicatively coupled to the electronic assembly, wherein the electronic assembly is configured to transmit one or more measurement parameters to the remote data system, wherein the remote data system is configured to calculate one or more values from the readout data acquired by the plurality of sensors.

17. The apparatus of claim 16, wherein the remote data assembly is configured to map the one or more values to the one or more locations of the substrate.

* * * * *